United States Patent [19]
Provenzale

[11] Patent Number: 5,421,739
[45] Date of Patent: * Jun. 6, 1995

[54] ONE-PIECE BRIDGE FOR CONNECTING MODULAR UNITS

[75] Inventor: Ronald A. Provenzale, Fremont, Calif.

[73] Assignee: Unisys Corporation, Blue Bell, Pa.

[ * ] Notice: The portion of the term of this patent subsequent to Dec. 7, 2010 has been disclaimed.

[21] Appl. No.: 223,270

[22] Filed: Apr. 4, 1994

Related U.S. Application Data

[62] Division of Ser. No. 4,031, Jan. 15, 1993, Pat. No. 5,304,077, which is a division of Ser. No. 746,456, Nov. 12, 1991, Pat. No. 5,267,873.

[51] Int. Cl.[6] .................. H01R 13/62; F16B 12/00
[52] U.S. Cl. .................................................. 439/347
[58] Field of Search ............... 439/928, 347, 716; 312/111; 220/23.4, 23.6, 23.2; 248/225.2

[56] References Cited

U.S. PATENT DOCUMENTS

| | | | |
|---|---|---|---|
| 3,117,353 | 1/1964 | Edwards | 248/225.2 |
| 3,517,977 | 6/1970 | Wenger | 312/111 |
| 3,599,828 | 8/1971 | Conway et al. | 220/23.4 |
| 4,478,464 | 10/1984 | Williams | 312/111 |
| 4,648,737 | 3/1987 | Lake, Jr. et al. | 312/111 |

Primary Examiner—Neil Abrams
Attorney, Agent, or Firm—John J. McCormack; Mark T. Starr

[57] ABSTRACT

A computer machine module with one, or several, coupling-faces thereof adapted for selective coupling to another like computer machine module, these modules to be coupled to one another by a planar coupling "bridge-structure" to be inserted between opposed faces of the modules, this coupling "bride-structure" having on each side an array of catches formed to engage an array of hooks on each coupling face when the modules are juxtaposed and when the coupling "bridge-structure" is inserted downwardly between the modules and shifted horizontally, with mating electrical connectors on the opposed module faces also being intercoupled by such juxtaposition.

19 Claims, 12 Drawing Sheets

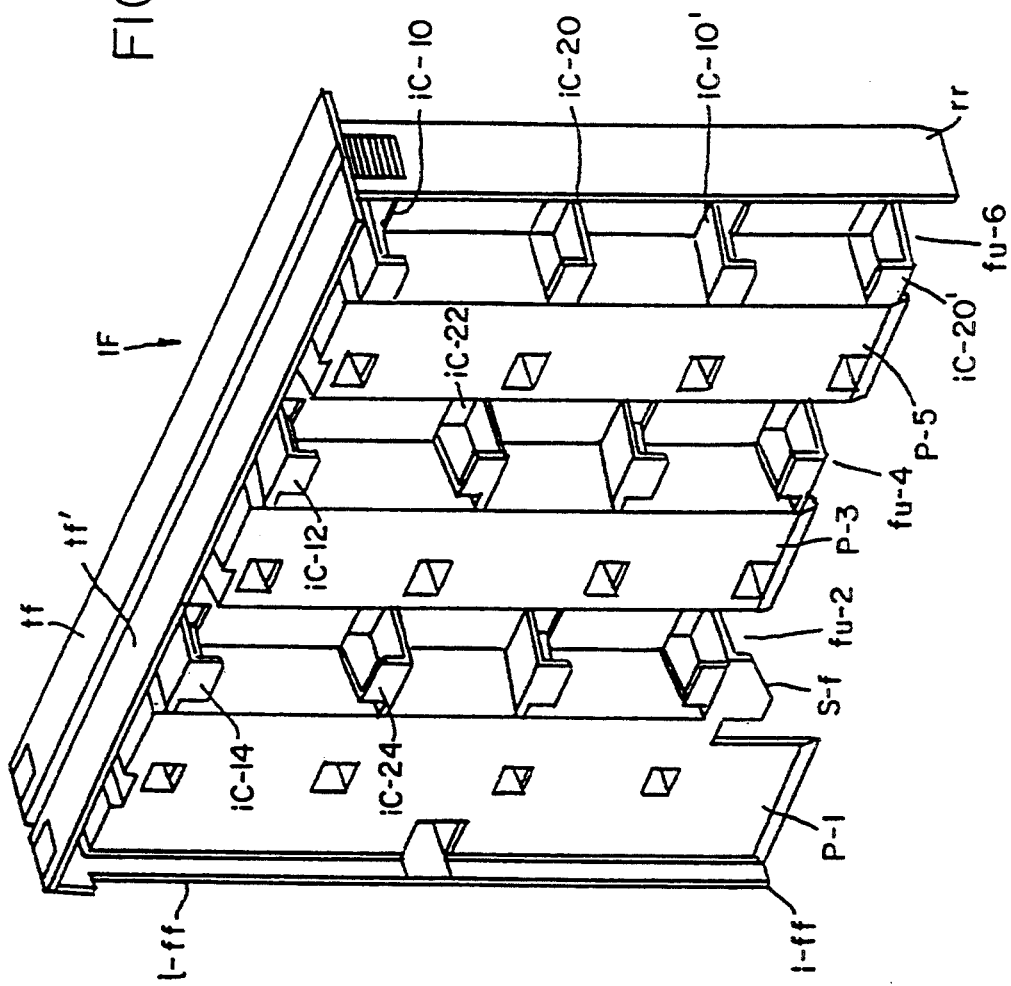

ONE-PIECE BRIDGE FOR CONNECTING MODULAR UNITS

This is a division of U.S. Ser. No. 08/004,031, filed 15 Jan. 1993, (now U.S. Pat. No. 5,304,077), which in turn, is a division of U.S. Ser. No. 07/746,456, filed 12 Nov. 1991, (now issued as U.S. Pat. No. 5,267,873).

This invention relates generally to arrangements for attaching outer covers to a machine structure and more specifically to techniques for so doing with connect faces that may alternatively be used for attachment of inter-couple means.

BACKGROUND

Small machines may be configured to be selectively, removeably interconnected with one another. They may also be arranged for selective, removeable attachment of a cover or "skin" on a given machine face. An object hereof is to use such a machine face arranged to be attached either to a cover or to a separate intercoupling for coupling the machine ("box") to another like machine ("box"). Sometimes this also involves connection of a so-called backplane (motherboard), with pin-socket connectors between boxes. Each functional unit (box) is typically built around a circuit board with edge-connectors (e.g., to plug into pin-socket connectors). A number of "daughter boards" are often connected to a common motherboard within a single box, e.g., to yield a single-box system with N sub-functional units. Expansion beyond these N functional units would require adding circuit boards in a second box which is connected (e.g., via jumper cables) to the first box.

A different approach is to use a separate box for each functional unit, with a motherboard in each box, this being connected to another like box via complementary pin/socket edge-connectors (e.g., with intermediate board-receiving socket connector means). A multi-box system can then be assembled by engaging the socket connectors on one box with those on a second box (and the second to a third, etc.—as workers understand).

For a modular arrangement, the system will be configured by adding like boxes (modules) as required, (e.g., up to a maximum set by maximum bus length). But, as the number of so-connected boxes increases, connection-problems arise. For instance, the pin/socket connectors require precise registration to avoid pin damage during interengagement of boxes. And, even with good registration, the (considerable) force required to manually engage/disengage such connectors can damage pins. Also, incomplete or improper connector-engagement can compromise system performance (e.g., and bring-down the associated data processing system). As workers realize, such box-connection problems can prevent present systems from fully benefiting from the modularity of a design.

This invention relates to coupling means for removably attaching one relatively small computer (box) to another, and involves a bridge-coupling structure to be interposed between such boxes, joiningly, when they are brought face-to-face. In a preferred embodiment, the bridge-coupling structure is a thin planar structure presenting a pair of opposed join-sides with catches arrayed thereon. The "boxes" to be so-coupled each have (at least one) coupling-face having hooks, or the like, each face adapted, and positioned, to removably mate with a respective one of the catches when the coupling structure (side) is fitted against this face. Preferably, these box-faces-to-be-coupled are first aligned and brought together, separated only by a tiny gap which the coupling structure bridges.

This invention modifies box structure to a minor degree and provides an associated bridge-coupling mechanism that makes it easier, more reliable and more practical to so-couple modular boxes into an expanded computer system. The invention facilitates a simple positive engagement/disengagement of each box via pin/socket connectors, while also adapting the (outer surfaces of) box-walls to be inter-engaged via such a "coupling bridge".

In general, one or several box-walls each presents an array of hooks, deployed and constructed to be removably engaged by complementary catches on the coupling bridge when the bridge is inserted between such box-walls. The hooks/catches are also preferably beveled to ease their inter-engagement. The hooks are deployed widely across the length and height of their wall-surface so that, upon engagement of the bridge, the boxes will be held together from widely-distributed points, with forces normal to their wall, and thus minimize sidewise forces on the connector pins.

Thus, we provide modified box-faces and associated inter-coupling bridge structure that facilitates quick, simple efficient interconnection of boxes to render a modular computer system. The bridge mechanism facilitates simple positive engagement/disengagement of the box-faces, with each box-face presenting hook members for engaging associated catches on (a respective side of) the bridge structure, the hooks and catches preferably having complementarily-configured camming surfaces to ease their interengagement.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements:

FIG. 1 is a perspective view of two modules adapted for use in a preferred embodiment of the invention, while

FIGS. 6AA, 6BB are front elevations of FIGS. 6A, 6B respectively.

DESCRIPTION OF PREFERRED EMBODIMENTS

Figure 1:
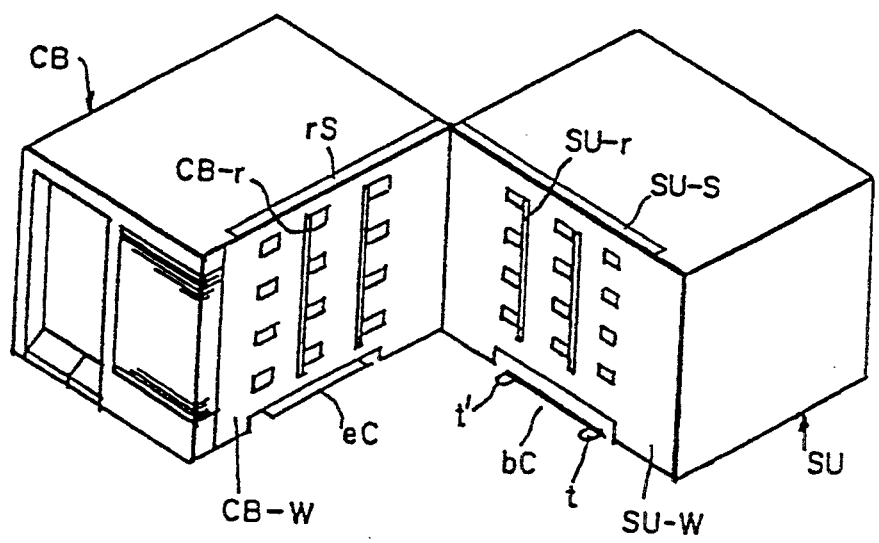
Figure 2:
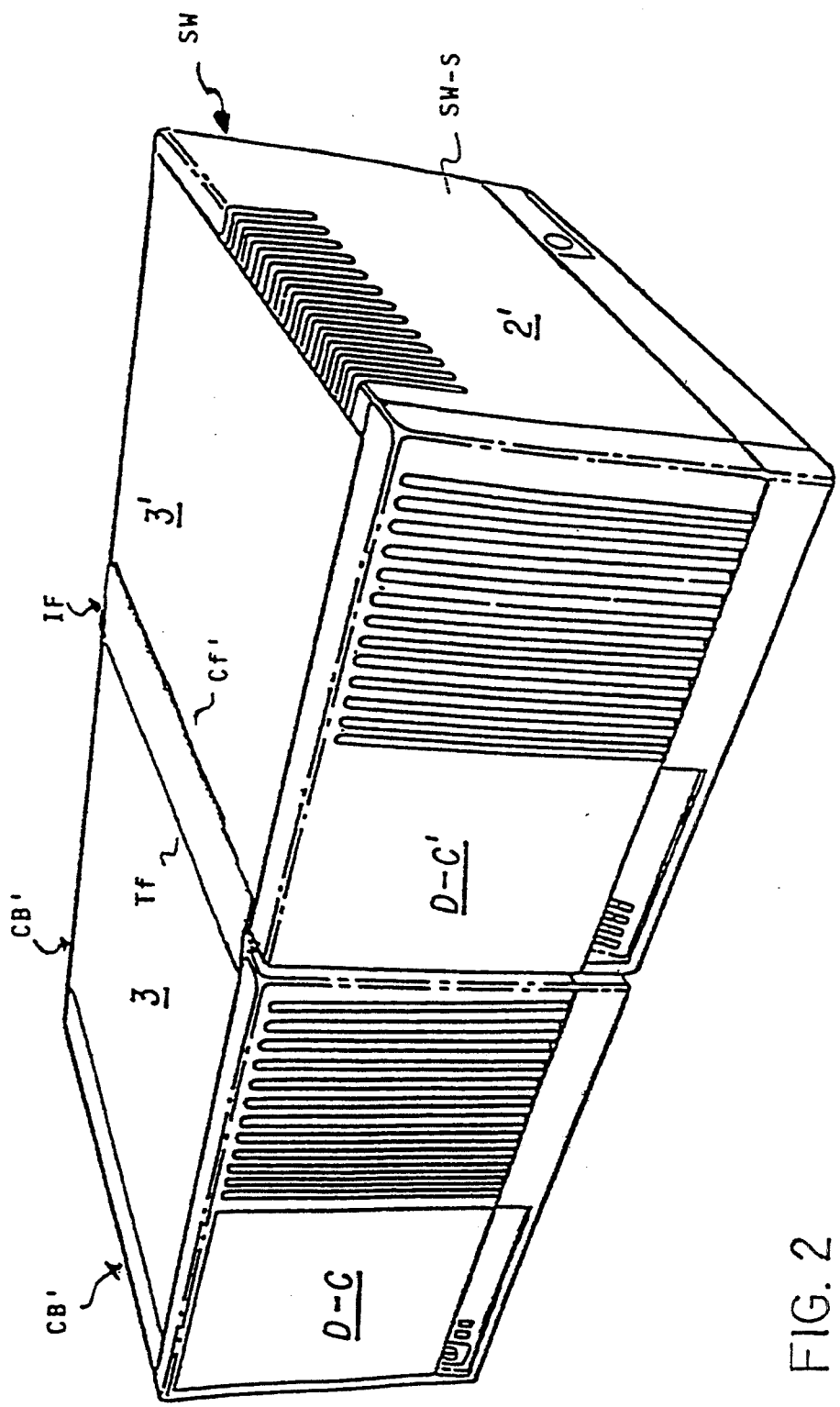
FIG. 2 shows the modules attached with this embodiment.
Figure 3:
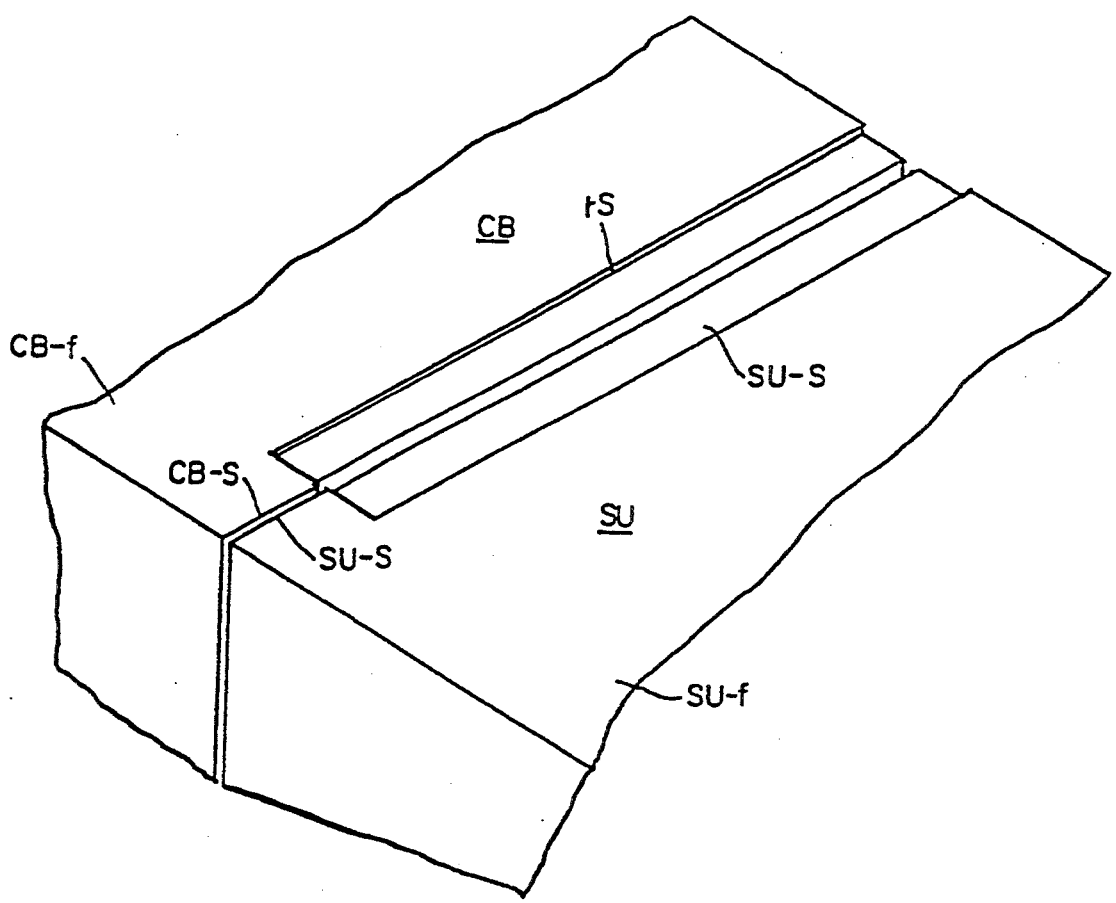
FIG. 3 shows the same with the bridge coupling thereof partly dislodged.
Figure 4:
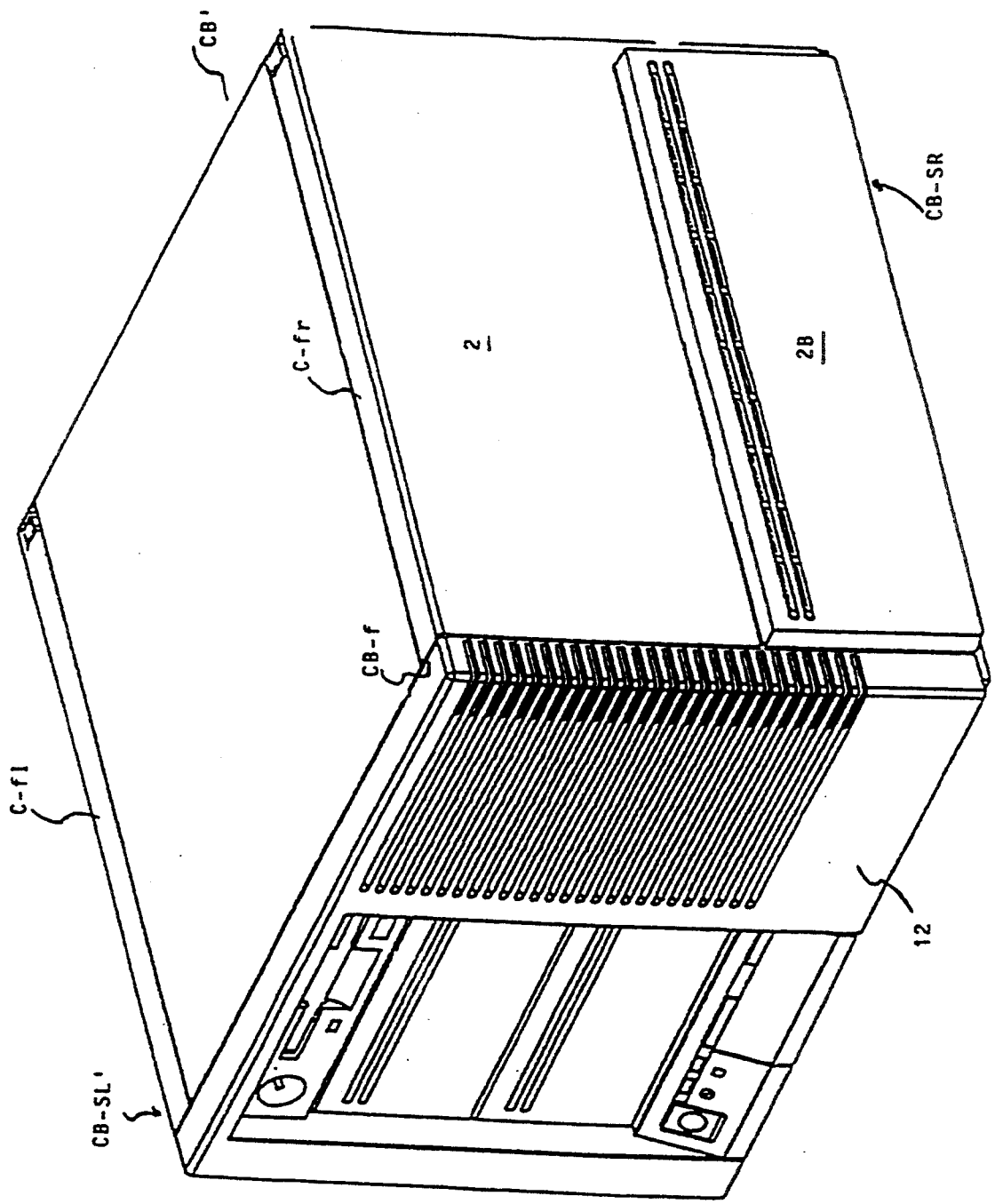
FIG. 4 shows one of the modules alone.

FIG. 1 is an isometric view showing first and second computer modules (boxes) CB and SU facing one another. FIG. 2 shows them coupled. Unit CB may, for example, house a main processor unit, while SU may house a dual floppy disk unit, units CB, SU to be coupled into an integrated computer system. Each box housing typically comprises an injection-molded plastic shell which encloses circuit boards and/or other components. At least one box will usually house a motherboard (backplane) 18, an edge-connector portion ec of which appears in FIG. 1. Typically, a motherboard presents electrical connector segments along one (or both) box-faces (e.g., face CB-w) so that, when it is coupled to a related box, its motherboard may be electrically connected to components therein. Thus, in the embodiment in FIG. 1, note that box CB presents edge-connector ec which includes a plurality of sockets (e.g., two rows of sixty), while associated box SU presents a related edge-connector bc including a corresponding plurality of pins engageable with the sockets ec when the boxes are joined. It will be understood that when such boxes are interconnected, their serially-connected motherboards may typically be coupled to define a common backplane data bus. FIG. 3 shows CB,SU engaged as in FIG. 2, with bridge 1F partly-inserted therebetween; FIG. 2, shows CB,SU as in FIG. 1, with bridge 1F placed therebetween. FIG. 4 shows CB alone; FIG. 5 shows the same with side-cover removed (with details of hooks h and guide-rib cbr on FIG. 5C).

The present invention provides a box-coupling bridge structure 1F (FIGS. 2, 3, 6) that effects engagement-/disengagement of such boxes and their cooperating pin/socket connectors. Boxes CB,SU (housings thereof) present respective related coupling-faces (walls) CB-w and SU-w, each wall presenting a spaced array of like hooks (e.g., see 3×4 array of hooks on walls SU-w, CB-w, FIG. 1). deployed across (most of) the length and breadth thereof. The two opposed, coupling-faces of bridge 1F are each configured (see FIGS. 6A, 6B, catches ic,cc) and adapted to engage a respective one of these hook-arrays with complementary catches arrayed and adapted to engage respective hooks.

Bridge 1F is preferably sinuously configured in cross-section (see FIG. 7, a section along H—H through FIG. 6AA, looking up from the bottom) to present like catch-arrays on its two faces, with one "offset" from the other; i.e., with catches on one face spaced a suitable lateral distance (see distance x, FIG. 6A, FIG. 7) from those on the other face.

Figure 7:
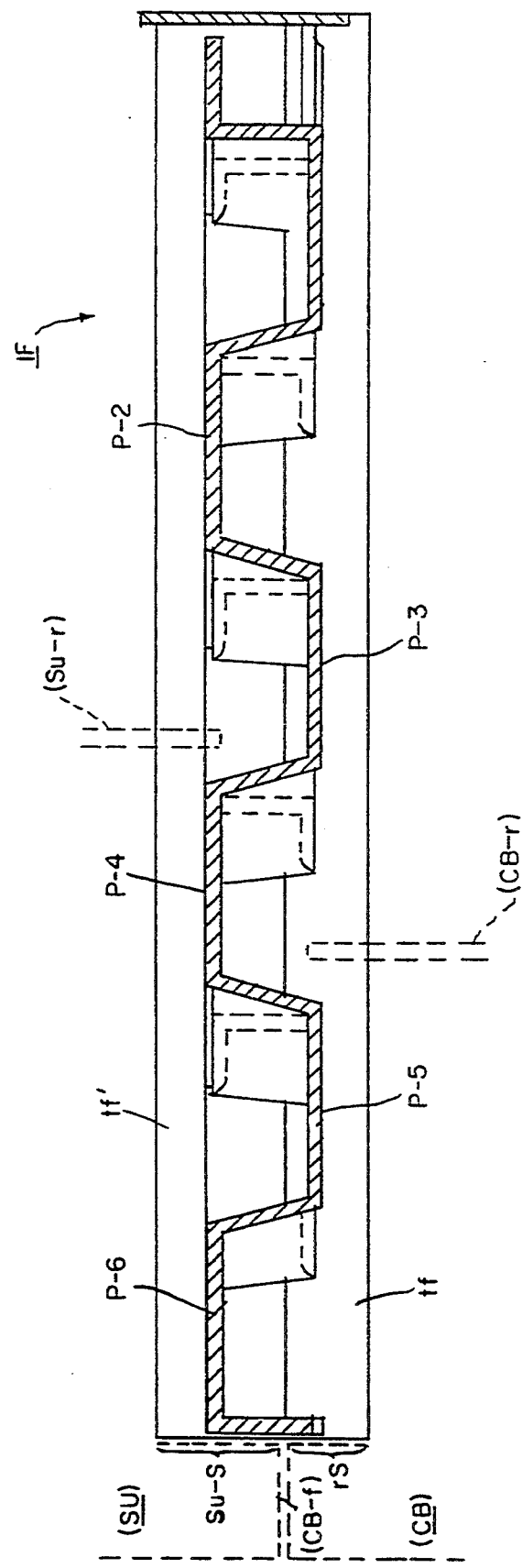
FIG. 7 is a section through this bridge coupling.

To engage the two boxes, one brings them together so that electrical connectors ec interfit with connectors bc (FIG. 1), leaving the opposed box-walls touching (e.g., as in FIG. 7 at faces SU-f, CB-f), with their (hook-equipped) facing walls opposed and coplanar, being separated by a prescribed separation-gap s-g (e.g., FIG. 7, about 1 inch here). This gap s-g is to be filled ("bridged") by insertion of bridge 1F (note details below).

In this preferred embodiment, second module SU preferably also has a "right-wall" (not shown) but opposite left-wall SU-w in FIG. 1), which matches the configuration of the "right-wall" CB-w of companion box CB. Similarly, the opposite (left) wall of box CB has a hook-array matching that of left wall SU-w of SU (shown in FIG. 1). This allows an additional module to be attached to either box module in the same manner that module CB is attached to module SU. Module CB, being a processor module, is typically (preferably) configured for addition of another module on its opposing wall (not shown in the figure).

Figure 5C:
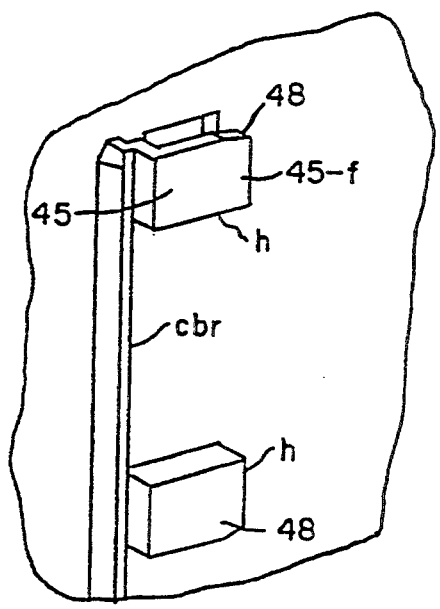
FIG. 5C shows enlarged details of FIG. 5.
Figure 5:
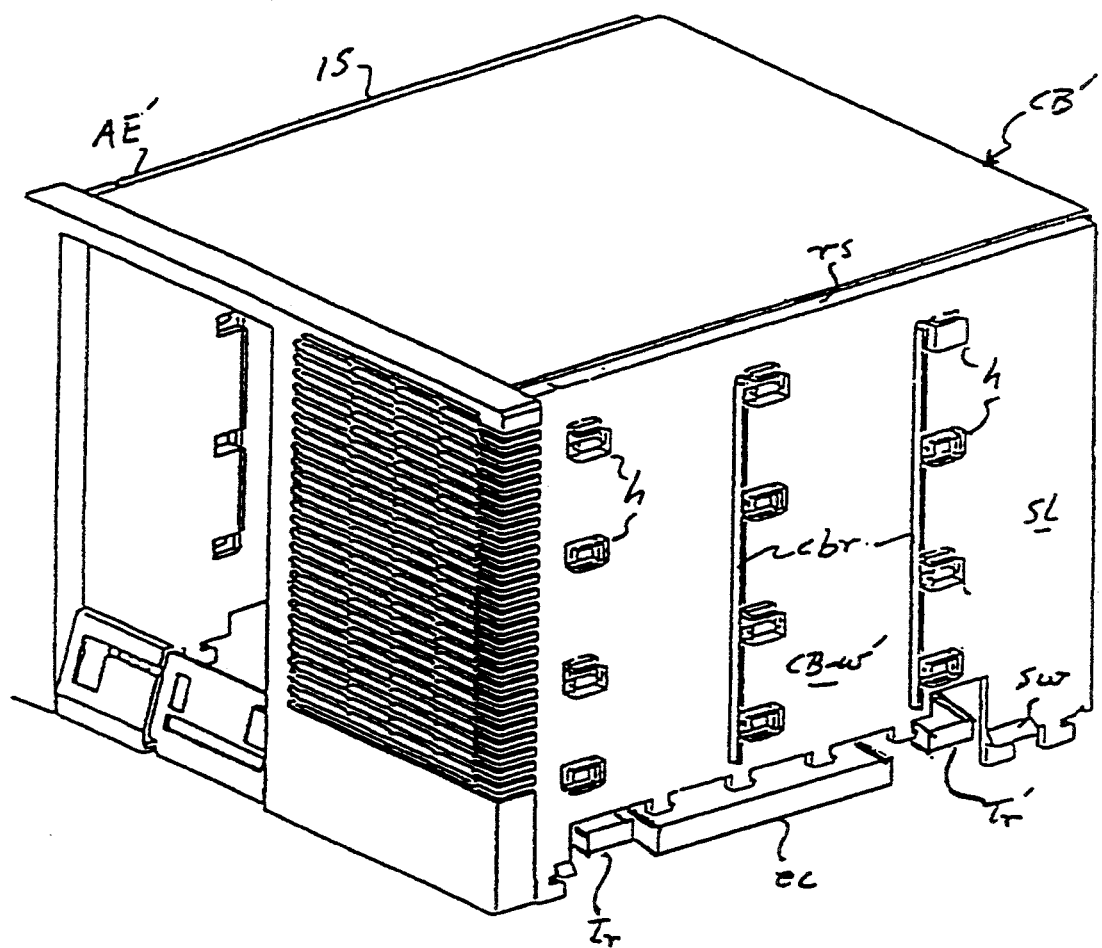
FIG. 5 shows the same with side-cover removed.

FIG. 5 shows box CB with its 3×4 array of hooks h on wall CB-w, enlarged, and a guide-rib cbr (and see FIG. 5C).

In general, the array of hooks h deployed on wall CB-w engage respective complementary catches (ic, FIG. 6B) on one side of CB-w bridge 1F, while hooks h' on wall SU-w similarly engage catches (cc, FIG. 6A) on the other face of 1F. Connector pins bc, are disposed within an elongate cavity 33 extending along the lower edge of wall SU-w centrally thereof). Wall CB-w carries an elongate shroud surrounding connector-sockets ec and is configured to register-within the cavity on SU-w when inserted therein. The hooks on a "right-wall" CB-w are preferably aligned in N columns and N' rows (here 3 columns, 4 rows), the columns being regularly spaced apart a prescribed distance c-s (FIG. 5) leaving intercolumn voids (slots sl) along the wall CB-w, while the hooks on (any) "left wall." (e.g., SU-w) are similarly deployed, but offset (by X distance) laterally, being arranged to confront (any) such "right" wall face with its hook-columns positioned about midway between the columns on the "right wall face".

Bridge 1F presents its catch-columns on one face so as to be similarly "offset" vs. its other face, being staggered (in "sinuous" cross section e.g., as in FIG. 7). That is, the regularly-spaced catch-columns on one face are stacked on a respective projecting "land" or "step" P (see FIGS. 6A, 6B, 7) configured to fit into a respective intercolumn space (e.g., sl, FIG. 5) on an associated box-wall, while the catch columns on its opposite face are similarly disposed to fit into like respective spaces on the other box-wall, being offset from the catch-columns on its first bridge-face (by distance x, or about ½ distance c-s). This leaves a bridge that is regularly "crenelated" in cross section (FIG. 7), with projecting catch-columns on one side configured to fitting between the hook-columns on one wall-face, and the catch-columns on its opposite face configured to fit between the hook-columns on a different, mating wall face. Preferably, several such hook-columns are each vertically aligned along a projecting guide-rib cbr (FIG. 5).

Hook members h are alike and U-shaped, each including a spacer portion 45 extending perpendicularly from its box wall and a distal hook-flange 45-F cantilevered out orthogonal from the end of its spacer 45, while also having a beveled camming-surface 48 spaced from and facing the external surface of its box wall. In the preferred embodiment, the angle of divergence of camming surface 48 (from the plane of the box wall) is about 15 degrees.

Each bridge face thus carries like-spaced columns of wedge-like catches ic,cc with the columns on each side interleaved, each catch-column being aligned along a respective projecting "land" P, with the set of projecting lands on one face offset (by x) from those on the other side. The catches are dimensioned and deployed to engage respective hooks of the wall they face, each preferably having a camming surface 53, (e.g., FIG. 6AA) configured for complementary cam-engagement with a respective camming surface 48 on the respective hook member 30.

Figure 5A:
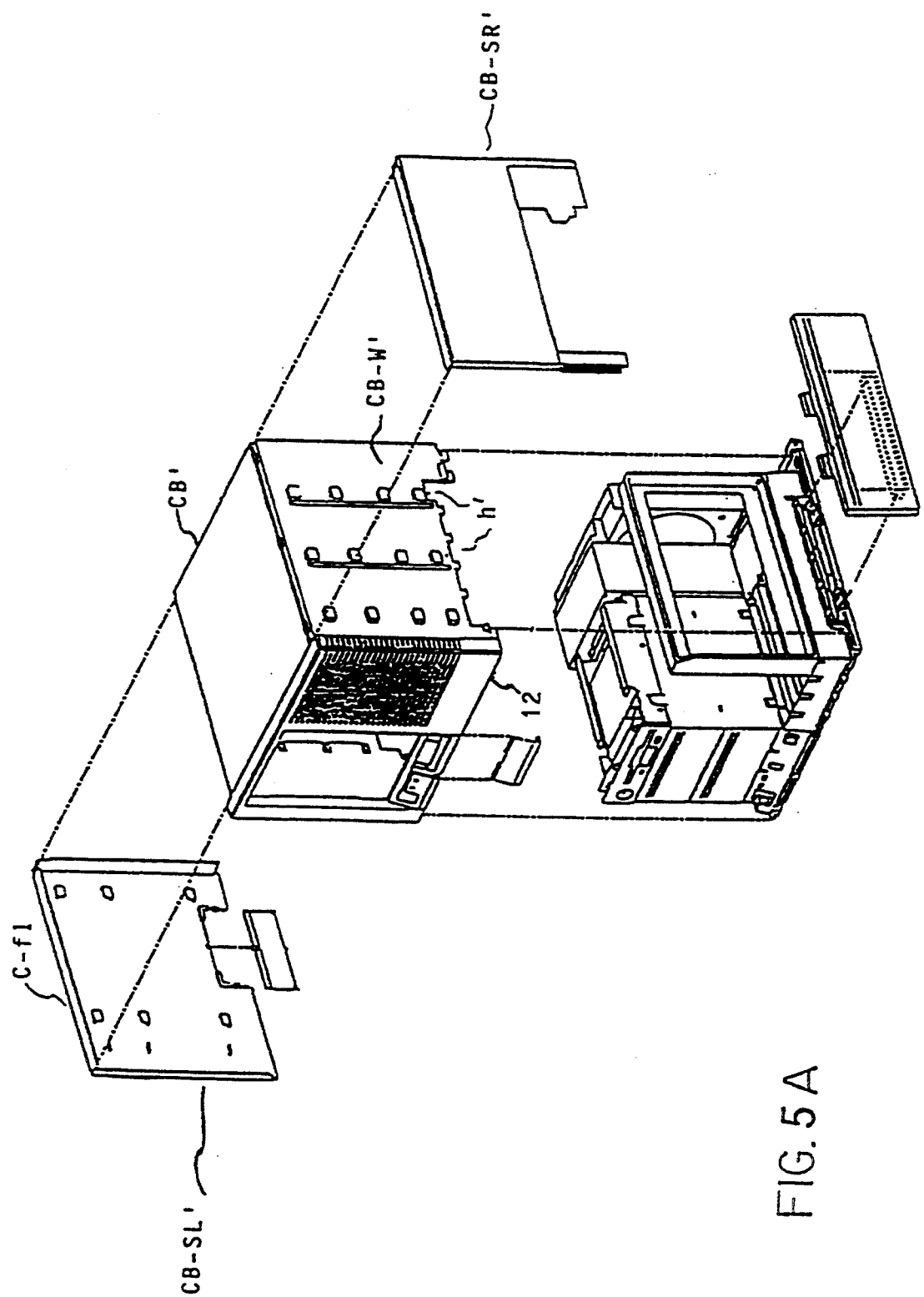
FIG. 5A shows this module with side-covers exploded-away.

FIG. 4 shows a modified desktop computer controller box CB', (e.g., VS CB in FIG. 1) with side covers thereof shown exploded-away in FIG. 5A (i.e., right side-cover CB-SR' and left side-cover CB-SL'), where the right side CB-w' of unit CB' will be seen as presenting a 3×4 array of like projecting hooks h disposed along vertical ribs cbr (FIG. 5), some of which are intended to engage like catches ic,cc (not detailed) on the inner side of right side-cover CB-SR' to allow removable attachment of CB-SR'. A similar array of such hooks h' (not shown) is presented on the opposite (left) side of CB' and likewise adapted to engage respective catches c' on the inner side of associated left side-cover CB-SL'. In certain cases, these cover catches c' need be provided for only some of hooks h'—e.g., in FIG. 5A, only a 2×3 array is provided because the covers are so light. Side-covers CB-SR', CB-SL' are principally aesthetic and are kept attached.

As a feature of advantage, the arrays of hooks h, h' are also adapted to similarly engage the novel coupling member (bridge 1F) used to couple a satellite unit to unit CB' (e.g., as with satellite unit SU in FIGS. 2). Further details on the preferred construction and use of hooks h, h' are given below.

Satellite-Coupling

FIG. 1 shows computer box CB' confronting an exemplary satellite expansion box SU (e.g., a like "box" having supplemental memory cards, disk units, etc.) to which it is to be coupled, mechanically, and electrically. Workers will recognize that such expansion units SU are sometimes used to house printed circuit boards or cards (e.g., for networking) which may be connected to a computer CB' for memory expansion or other data storage (including hard disk drives, or other means for increased storage capacity). Other peripheral devices in the general category of such external expansion units include modems, networking cards, graphics adapters, printers, and outboard disk drives which, as a general rule, are standalone devices which are not physically attached to the main computer unit except by means of wires or cables.

An external expansion unit (like SU here) may be connected to the computer via an external cable and/or one or more multi-pin electrical connectors. The external expansion unit itself is a separate and distinct unit and is not integral with the body of the computer CB'; therefore, it may be inconvenient to transport both boxes (the computer and its external expansion unit) together. The use of an external expansion unit can thus detract from one of the primary advantages of desktop computers: their portability.

It is desirable that an expansion unit be connected to its host computer box such that both may be moved together as a unit, while the expansion unit remains electrically connected, being firmly attached to the (outer surface of the) computer. For example, one might contemplate a portable personal computer that include optional expansion units which are electrically connected via multi-pin connectors to their host computer box and are physically attached to the outer surface thereof. However, with such expansion units a problem arises in that the weight of the expansion unit places undue stress on the multi-pin inter-connectors—this for lack of secure, solid means for mechanically coupling the two while maintaining their electrical inter-connection—when the two boxes are moved as a unit. Stress on the multi-pin connectors commonly leads to problems in passing data signals between the two units. These interconnect problems are obviously very undesirable, particularly when the expansion unit is used for add-on memory.

One approach to solving these problems is seen in U.S. Pat. No. 4,501,460 to Sisler; a related approach is seen in U.S. Pat. No. 4,893,263 where the interconnect means between an expansion unit and a portable computer comprises ribs and latch means: i.e., interlocking a first set of horizontal ribs on a mating surface of each unit, these providing support for the computer expansion unit and helping to relieve stress on the multi-pin electrical connectors. The related latch mechanism is for releasably interlocking the two units and includes a set of hinged hooks in the expansion unit, these apt for quick connection/disconnection from corresponding slots in the (outer surface of the) portable personal computer. This latch-interconnect means securely holds the expansion unit against the computer, so the two may be transported as one integral unit with less risk of stress on the multi-pin connectors. However, workers prefer to avoid latches and other moving parts.

Thus, it is a salient object of our invention to provide interconnect means between a small computer (housing) and its expansion unit which addresses the above problems, and, particularly which allows the expansion unit to be integrally attached (removably), while alleviating associated stress on the multi-pin connectors between the two "boxes" yet without moving parts. It is a further object to provide each box with simple hook means and to provide associate hook-engaging "one-part" "bridge" means which can engage the two boxes (hook means) and together, and accommodate rapid, easy interconnection/disconnection, coupling the two boxes very firmly, with minimal risk of damage to the electrical interconnects.

Now, referring to FIG. 1, desktop computer unit CB' is shown separated from, but somewhat adjacent, a related satellite expansion unit SU, with one sidewall CB-w of CB' shown facing a related sidewall SU-w of unit SU. It will be understood that the two sidewalls are to be coupled together. A multi-pin connector ec of known type on wall CB-w will be understood as adapted for mating electrical connection with related multi-pin connector bc on unit SU.

Workers may prefer to accommodate such engagement (abutment) of such boxes (CB', SU) in a fashion that also couples them electrically (e.g., power, bus lines) and thus dispenses with need for a cable or the like. To this end, the array ec of connector pins may be provided along one sidewall CB-w, with registering socket means on the confronting sidewall SU-w.

And, to facilitate proper initial alignment of the two sidewalls as well as to guide their proper abutting placement (and pin-socket registration), we prefer to provide locate-guide means, such as tongues t,t' on one box (e.g., SU), with associated receiving guideways tr, tr on the other box, e.g., CB', FIG. 5). Thus, locator-tabs t,t' projecting from SU, will be seen as used for guiding wall SU-w into correct coupling alignment with wall CB-w, being received in locate-slots therein as known in the art. Of course, tongues t,t' may be made sufficiently rigid to help support the coupled boxes vertically, and will also help keep them aligned laterally. Walls CB-w, SU-w will be seen as each presenting a spaced array of hooks thereon.

Now, according to a feature of this invention, the coupling member (bridge) is provided with an array of catches on each side for engaging the hooks on sides CB-w, SU-w.

Figure 6A:
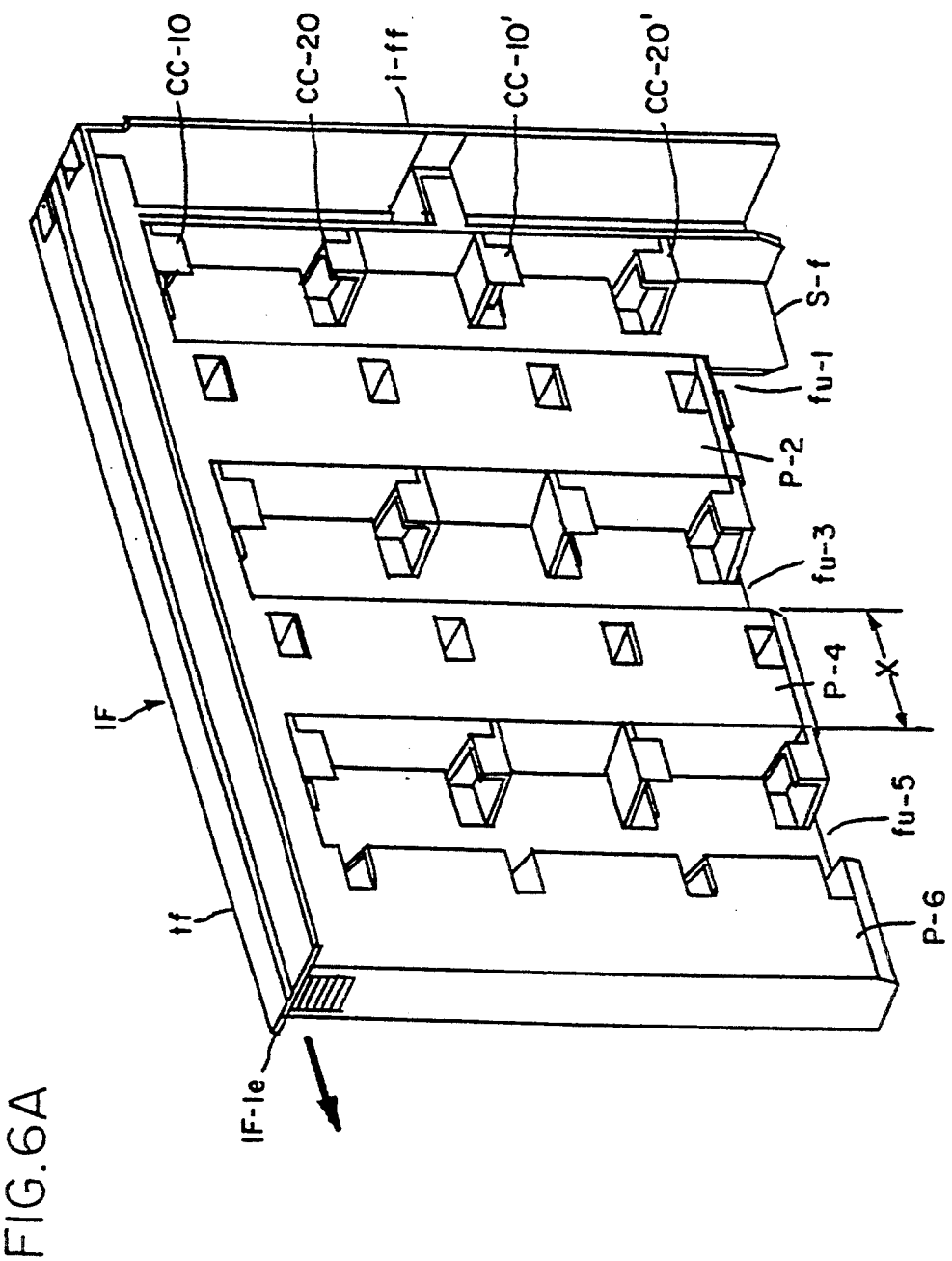
FIGS. 6A, 6B show the bridge-coupling in perspective, from the right and left side thereof, respectively.
Figure 6A:
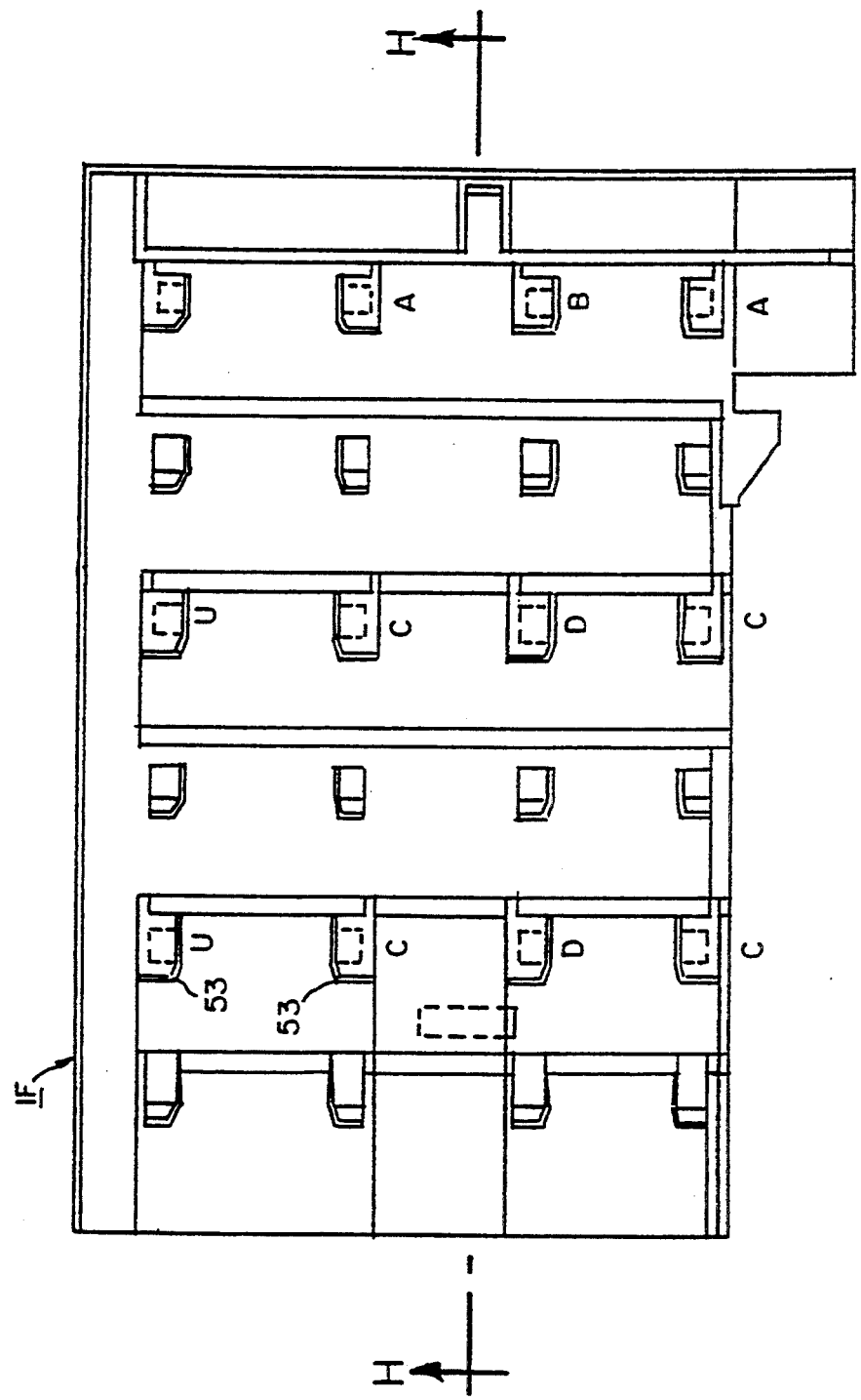
Figure 6B:
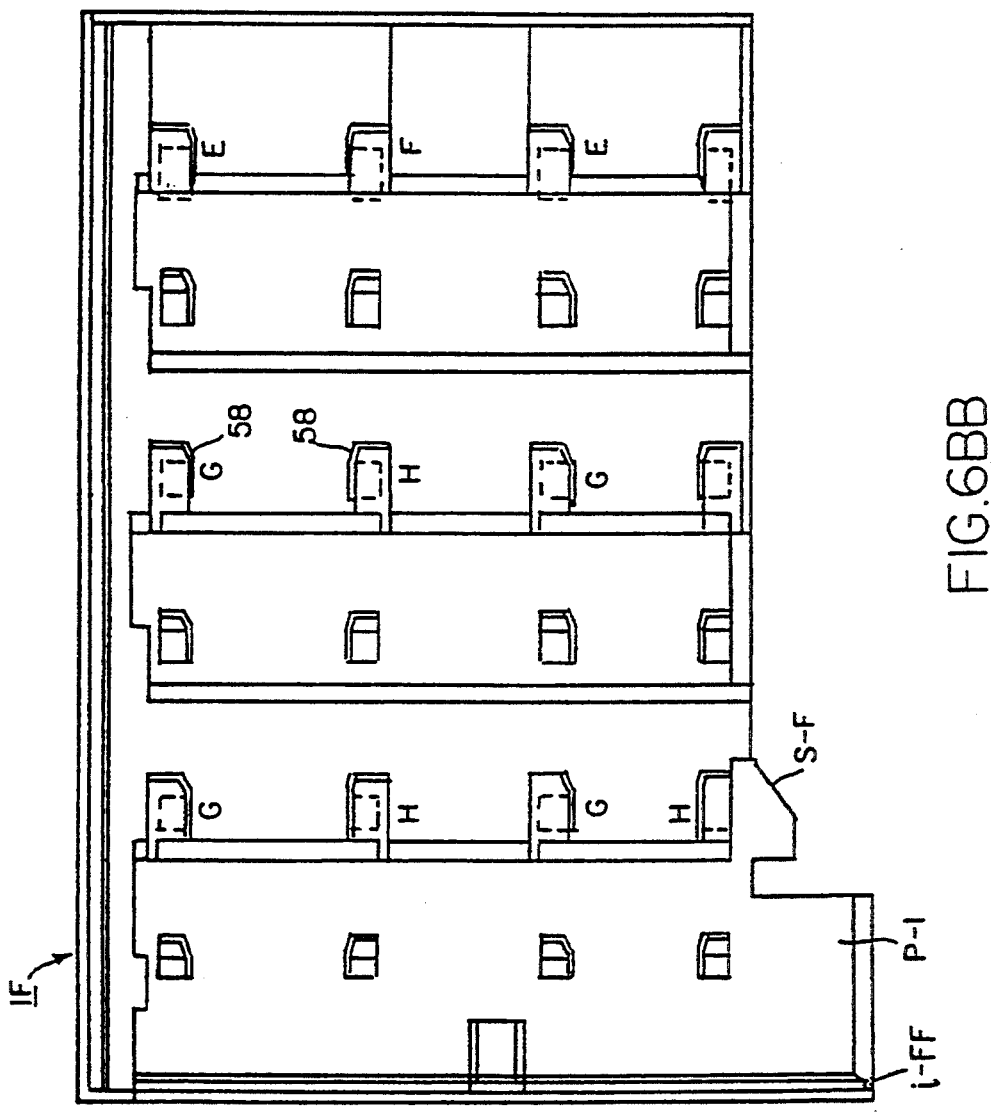

In FIGS. 6A, 6B right and left sides of coupling member ("bridge") 1F are shown, while in FIG. 2, 1F is shown fully-inserted between CB and SU, and in FIG. 3, 1F is shown partly withdrawn from between CB and SU. Before inserting 1F (FIG. 2) it will be understood that CB and SU will have been pushed together, side SU-w having been aligned with side CB-w, (tabs t,t' having been carefully aligned and thrust into their slots in CB-w, until connector bc mates with ec to place CB' into proper electrical contact with SU, as known in the art). That is, once box CB' is thrust into aligned-connection with box SU, bridge 1F may then be inserted between them, being thrust fully-down between CB' and SU (as in FIGS. 2,3)—its projecting pillars p on each side (see FIGS. 6A, 6B) sliding down along respective vertical slots along the confronting box-face (e.g., see slots sl on face CB-w between hook-ridge guides cbr in FIG. 5, 5C). Bridge 1F is then thrust a bit sidewise (so its catches engage receiving hooks on sides CB-w, SU-w as detailed below.)

Unit SU may then be considered securely, yet removably, attached to computer CB' via bridge 1F, mechanically and electrically—according to this invention feature. The resultant inter-engagement of CB' to SU will be seen as so surprisingly firm and secure that the composite assembly (CB-1F-SU) may be lifted securely and easily moved about as an integral unit, without risk of accidental disengagement, or of damage to CB, to SU or to their now-mated connectors ec, bc.

Figure 5B:
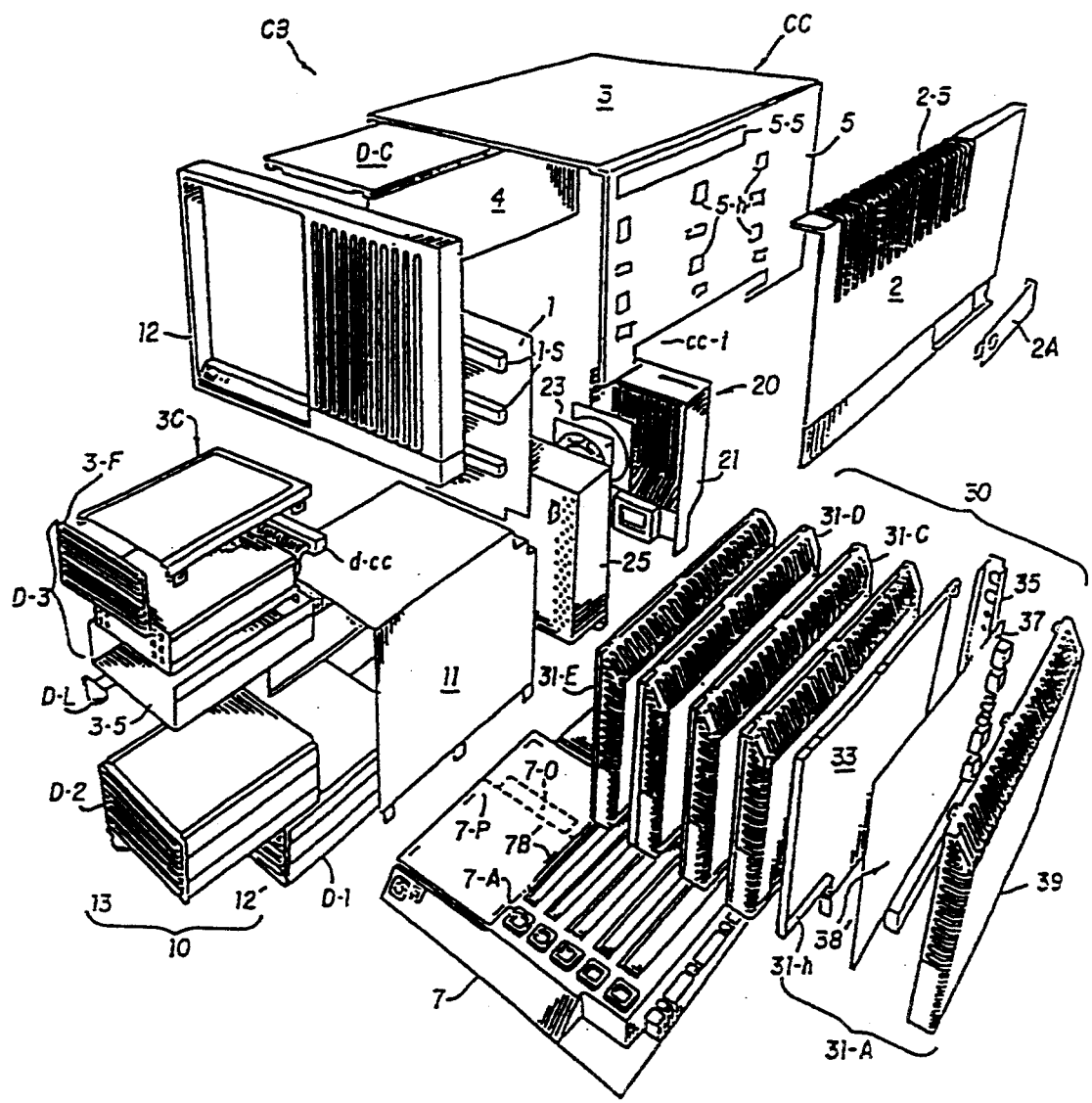
FIG. 5B shows the module further exploded-apart.

Note: both faces of CB are preferably so fitted with hooks h, so a satellite unit may be so attached on either, or both, sides of CB. And, advantageously, the hooks h,h' can also be used to engage side-covers as indicated in FIGS. 4, 5A, 5B. Such hooks are easy to provide on the sides of CB and on the sides of satellite units. They provide retentive force spread wide across the faces of the so-coupled boxes. Yet so coupling satellites merely requires the insertion of the bridge therebetween—with no need for latches locks, actuators or other such moving parts, just a passive, one-piece interconnect. As below noted, a large number of retainer catches, and complementary hooks, are preferably used—dispersed widely across the length and height of each coupling-face, to thus spread-out and reduce the needed coupling forces.

That is, according to this feature, one can thus couple such units via our novel interface-bridge 1F which need merely be slid-in between the facing units—and which removably intercouples them so well that units can then be picked up as one entity and carried off without incident. This bridge 1F is detailed in FIGS. 6A, 6B and 7 (cf. its "right" side is shown in FIG. 6A, and its "left" side in FIG. 6B, in perspective, and enlarged elevation in both—with catch elements symmetrical on each side, but laterally offset).

It will be noted that each box CB SU, etc. to be so coupled exhibits a side (at least one) with similar array of hooks h, h' for so-engaging bridge 1F (as well as covers CB-s, as in FIG. 2).

Thus, each side (face) of bridge 1F may be considered as presenting a number (here three) of like, coplanar pillars p separated by like troughs (or furrows, fu) where the catches are placed—with the pillars on one face serving, on their reverse side, to form the furrows, fu on the opposing face (all the same width). Thus, consider FIG. 6B showing the left face of bridge 1F where pillars p-1, p-3, p-5 are interspersed by furrows fu-2, fu-4, fu-6, each furrow having a like column of catches ic spaced identically therealong. Compare the right face of this bridge 1F in FIG. 6A, where pillars p-2, p-4, p-6 form the backside of furrows fu-2, fu-4, fu-6 (in FIG. 6B). And, like "left-furrows" fu-2, fu-4, fu-6, the "right-furrows" fu-1, fu-3, fu-5 (FIG. 6A) also each have a like column of catches cc spaced therealong. FIG. 6A is shown in side elevation as FIG. 6AA; similarly FIG. 6B is shown in side elevation in FIG. 6BB.

The array of catches along each such furrow is identical, with catch structure identical but alternately, inverted: "up/down/up/down"; that is, each furrow has a down-catch at the top, then an up-catch below, then another down-catch below that, then an up-catch at the bottom. Thus, for instance in furrow fu-1 (FIG. 6A), we have down-catch cc-10, up-catch cc-20, down-catch cc-10', then up-catch cc-20'. Each such catch will be understood in positioned and configured to engage an associated hook on the side of a box (e.g., cc-10 to engage some up-hook, cc-20 to engage the adjacent down-hook).

Similarly, for bridge 1F, the array of catches ic on the left face thereof are arranged to engage a like complementary array of hooks on side CB-w of box CB, while similarly the array of catches cc on the right face of 1F are arranged to engage a like complementary array of hooks on side SU-w of box SU. As seen in FIGS. 6A, 6B, all catches ic,cc are identical in structure, being L-shaped so that when deployed they form a U-shaped catchment into which can fit a like, upside-down, U-shaped mating catchment h on the box wall.

As a note of construction convenience, it will be seen that the U-shaped hooks/catches (h on CB-w, h' on SU-w, and ic, cc on bridge 1F) all "cover a hole" in the wall-area subtended by them—this is optional and a mere matter of manufacturing convenience (in the course of molding the respective panels from plastic, as artisans will understand).

Thus, in FIG. 5 for instance, side CB-w' of box CB' is observed to present three columns (pillars pp, each with four hooks h) and four rows of like hooks h, these alternating up/down/up/down along their pillar to complement the catches on 1F, and equi-spaced to engage catches ic on the left face of 1F (FIG. 6B). This 3×4 pattern is repeated on all box sides (to be coupled) as well as on the opposed sides of bridge 1F, of course. Thus, hooks h will be oppositely-configured from catches ic, i.e., a top row of identically spaced "up-hooks" for "down-catches" ic-10, ic-12 ic-14 (FIG. 6B); under that is a like row of "down-hooks" for engaging "up-catches" ic-20, ic-22, ic-24; then another row of up-hooks for engaging ic-10', ic-12', ic-14', then a bottom-row of down-hooks to engage ic-20', ic-22,' ic-24'. (Of course, one could reverse the order of up/down catches—the catches will be understood as so "alternated up/down" to better resist shear and excess flexing, once engaged.)

A like coplanar array of like hooks h' is presented, on the facing sidewall SU-w FIG. 1 of companion box SU, but offset from those on CB-w'. Thus, when side SU-w is juxtaposed with side CB-w', these hooks will be each disposed in offset relation with a like hook h on wall CB-w. The inner surface of each hook h,h' is projected a prescribed uniform spacing c-d from its base on the wall.

The interface-couple means ("bridge" 1F) is introduced between CB' SU, once CB-w is abutted in alignment vs. SU-w. Bridge 1F is adapted to be shifted sidewise (see arrow - FIG. 6A) so that it engages hooks h, h' with its own respective catches cc,ic—to thus removably couple the boxes CB', SU'. Bridge 1F is constructed to do just this, presenting, on each of its two sides the aforedescribed like, offset columns of catches, ic,cc (these offset horizontally). Thus, the catches on each side of 1F are arranged and disposed to engage a respective array of box-hooks, with each catch oppositely-configured from its facing box-hook (e.g., an up-catch ic is to engage a down-hook h on box CB').

More particularly, on one side of bridge 1F, (cf. FIG. 6B), a top row of "down-catches" ic-10, ic-12, etc. is presented so that each can removably interfit with the top row of up-hooks on a given first sidewall (e.g., hooks h on CB-w, FIGS. 1,5), these being coordinately configured to engage catches ic on 1F. Likewise, the top row of catches cc-10, cc-12, cc-14 on the opposite face of 1F are offset from catches ic, and arranged to engage up-hooks h' (top row) on side SU-w. As aforesaid, the catches on one face of 1F are identical in structure and vertical placement with those on the other face, but are offset laterally (e.g., to minimize width of 1F, and couple CB' closer to SU).

FIGS. 1,3 indicate the coupling-abutment of box CB' with SU, with bridge 1F shown partly-inserted in FIG. 3 (after completing the insertion of 1F, then a lateral sliding thereof will so engage its catches with the hooks of SU and CB'—this being understood as completing its coupling action, as indicated schematically in FIG. 2). The leading edge of the catches is preferably chamfered to help ease engagement with their hooks, as artisans will appreciate (e.g., see 58 on ic in FIG. 6BB; cc in FIG. 6AA for 15° chamfer).

When bridge 1F is to be inserted between boxes CB', SU (sides CB-w, SU-w thereof), the boxes will have been brought adjacent in alignment (cf. tongues t,t' on SU aligned with receiving slots in wall CB-w; then partly inserted to let the end-bevels on the tip of the tongues give "fine-alignment") so that the electrical pin-connectors are placed in mating alignment; then, further thrust of CB vs. SU completes the connector-mating and places reference edges of the boxes in abutment (e.g., note FIGS. 1, 3, 7, wall CB-w being set back along the rest of its length to accommodate insertion of bridge 1F). The (plastic) catches and hooks may bend slightly. (cf. hook-to-catch gap is preferably about 20±5 mils; not a "friction fit".)

When bridge 1F is then initially inserted between CB', and SU (into this "setback" as shown in FIGS. 3, 7) its pillars p fit into the spaces (e.g., sl, FIG. 5) between hook-columns on each sidewall, and are guided along a respective rib on the respective sidewall (e.g., see guide-ribs cbr on sidewall CB-w, FIG. 5, and like ribs SU-r on sidewall Su-w, FIG. 1; e.g., "left-pillars" p-1, p-3, p-5 fit into spaces sl between hook columns of sidewall CB-w; and "right-pillars" p-2, p-4, p-6 fit between columns of hooks on sidewall SU-w). 1F is driven down until it bottoms (e.g., on switch-foot s-f, see FIG. 6A, described below). Registry of a pillar p vs. a guide-rib will be seen as helping to guide bridge 1F as it is moved up or down.

Then, bridge 1F is shifted sidewise (e.g., see arrow in FIG. 6A), to engage hooks h, h' on the respective sidewalls with a respective adjacent facing catch on 1F,—1F is driven sidewise—until these hooks and catches are fully engaged. The boxes CB', SU are now removably intercoupled as one structure.

As a preferred refinement, at least one (preferably both) of the facing box edges, on top and in the rear, are cut-out to provide a "step" just sufficient to receive an associated (top, side) flange of bridge 1F and thus form a smooth coplanar surface across the two boxes and the intervening bridge. Thus a pair of top flanges tf,tf' (e.g., see in FIGS. 6A, 6B) are provided, to be received snugly in a respective "step" formed along the top edge of boxes CB,CB' and SU (e.g., see steps rs, ls on CB', FIG. 5; similar step SU-s on box SU, see FIG. 1). Flanges tf,tf' also provide a "stop" limiting down-insertion of 1F. Similar steps are provided along the rear edges of box CB' (e.g., see rss, FIG. 5) and SU, these each being adapted to receive a respective part of rear flange i-ff of bridge 1F (e.g., see iff in FIGS. 6A, 6B); these also serving to limit the sidewise hook/catch-engaging movement of bridge 1F.

Couple 1F will be seen as thus constructed to have a sinuous cross-section (see top sectional view, FIG. 7 along section lines H—H of FIG. 6AA) with like, like-spaced, like-width vertical pillars p on opposing sides; these forming furrows on their opposite side, and with a vertical column of catches disposed along one vertical-edge of each such furrow, the other vertical edge thereof being used, preferably, to engage, and "follow", a respective vertical guide-rib on the engaging box-face CB-w' SU-w. (See ribs CB-r on CB-w', SU-r on SU-w, FIGS. 1,5).

Catches ic,cc (FIGS. 6A, 6B, 7) will thus be seen as projected out from a respective edge of their "raised-pillar" p and in staggered relation. (E.g., in FIGS. 7, 6A each right-side vertical row of catches cc is viewed on the "left" edge of pillars p-2, p-4, while left-side catches ic (FIGS. 6B, 7) are on the "right" edge of pillars p-1, p-3, p-5). The "other edges of these pillars p will serve as "guides", engaging ribs CB-r or SU-r on respective faces CB-w', SU-w (each vertical column of hooks h on face CB-w' is aligned along a given side of a respective rib CB-r', while similarly, each column of hooks h' on face SU-w is aligned along the opposite side of a respective one of ribs SU-r thereon—these ribs thus engaging a respective "catch-less" pillar-edge on 1F when 1F is inserted/withdrawn. The (uniform) spacing of catches on the right side of 1F (FIG. 6A) and the (uniform) width of associated bridge-troughs (recesses) fu will be understood as accommodating (room for) the vertical rows of hooks h' on face SU-w during 1F-insertion, while the opposing troughs fu and their associated pillars on the left side of 1F (FIG. 6B) will similarly accommodate their respective columns of hooks h on face CB-w.

Thus, these catch-including troughs on 1F also serve to provide guiding column-edges, being positioned during insertion to oppose respective vertical stacks of hooks, with the catchless side of each trough engaging a respective rib on the facing box-side.

As a feature hereof, these pillars have substantial length (e.g., most of box height) and width, and will lie in contact with the surface of a box-wall, when inserted,—and so give excellent stability and resistance to vertical or horizontal rotation of the box. And, the sinuous configuration of the bridge itself reinforces this.

And, the placement of catches ic,cc on bridge 1F is such that, when 1F is fully-inserted down between CB', SU (FIG. 1), each catch on 1F will be operatively adjacent a respective receiving-hook on CB-w' or SU-w, so these catches/hooks will smoothly, slideingly engage when 1F is shifted sidewise (chamfer on leading edges preferably provided to ease the initial engagement—assume here that each catch-hook to be so engaged will be "oppositely-configured", with an up-catch facing a like-dimensioned down-catch, as workers will understand").

Operation

In summary, the inter-coupling of boxes CB,SU is preferably done by simply:

1. aligning sidewalls CB-w, SU-w so that tongues t,t' on SU register with their receptacles r,r in CB; then sliding CB-SU together into abutment (projection CB-f, abut SU-w, FIGS. 1, 3, 3A, 7), with the connectors ec,bc thereby fully-engaged;

2. then aligning bridge 1F so its leading edge 1F-1e (FIGS. 6A, 7) with arrows AE (FIGS. 2,3), and so its pillars p, on each side, align with the spaces sl between hook-pillars, and so pillar edges register vs. guide ribs on CB-w, SU-w,—then pushing 1F down into the interspace, with pillar-edges 1F-c, 1F-c' guided by guide rails CB-r, SU-r to "bottom", with top-flanges t,t' of 1F fitting into respective receiving box "steps" rs, SU-s, and so to smoothly fully-close the top of the inter-box gap (e.g., so top flanges tf,tf' become flush with box tops 3,3', FIG. 2);

3. then, shifting bridge 1F sidewise a bit (e.g., 0.6" to left in FIG. 3)—sufficient to slide the chamfered leading-edges of its catches past their engaging box-hooks (cc vs. h, ic vs. h') and thus seat skirt 1F-f to be coplanar with the rear sides of boxes CB, SU (1F finally "seated" into steps on top and in front of CB', SU),—whereupon the tab on handle 1F-h will "click home" and beveled detent foot s-f (FIG. 6A) will depress its switch CB-SE' sufficient to indicate "proper coupling" to the control system in CB.

In removing bridge 1F, it is slid (right-ward) to bottom vs. ribs CB-r, SU-r, clearing its catches from their hooks,—and then it is lifted up, and out.

Of course, this firm mechanical engagement provided by bridge 1F helps to maintain the associated electrical inter-connection (e.g., vs. accidental dislodgement, or separation of boxes)—yet disengagement is simple, quick and easy too—i.e., one simply pushes 1F slightly sidewise, to disengage all catches (i.e., to right in FIG. 2) until hooks and catches are disengaged, and column-edges on 1F engage the ribs CB-r, SU-r of confronting box-faces—and then one raises 1F and withdraws it from the inter-space.

Boxes CB, SU may now be gently separated, disengaging connectors ec/bc and tongues t,t' from their receiving slots.

CONCLUSION

In summary, it can be seen that the present invention provides an improved bridge mechanism which facilitates the interconnection/disengagement of modular boxes, alleviating problems associated with engaging related multi-pin connectors, and facilitating box-coupling to accommodate provision of a multi-module computer system.

While the above describes how to make and use certain invention embodiments, various alternative constructions and techniques may be employed without departing from the true spirit and scope of the invention as here claimed.

For example, the bridge 1F, which is shown coupling a "left" wall of box SU (FIG. 1) to the "right" wall of box CB could equally well be used to couple the "left" wall of box CB with the "right" wall of another such modular box.

Additionally, the camming surfaces (e.g., hooks/catches) may be flat or curved; they may exhibit a cam bevel of any suitable angle or construction, the particular angle depending on the leverage desired.

Moreover, while four rows and three columns of hooks/catches are disclosed, other arrangements are possible (e.g., more or fewer rows/columns). Generally, the forces should be distributed widely across the so-coupled walls. In certain cases, one may have more hooks/catches (columns thereof), or fewer. The spaced catch-lands (on bridge-faces) are interleaved from side to side preferably, and should project sufficiently toward their respective box-face to position the catches thereon for engaging respective hooks.

Workers will appreciate how aptly such a bridge structure and related means are combined to inter-couple such boxes securely—e.g., for coupling desktop computers with satellite units and the like. In particular, it will be appreciated that such "bridge-coupling means" can be used to improve the secure connection of such—something workers in the art will applaud. Workers will also appreciate that such coupling means may be used to inter-connect other similar boxes in related environments.

It will be understood that the preferred embodiments described herein are only exemplary, and that the invention is capable of may modifications and variations in construction, arrangement and use without departing from the spirit of this invention.

Further modifications of the invention are also possible. For example, the means and methods disclosed herein are also applicable to stable, secure positioning-engagement of other computer modules and related expansion units in similar systems and environments. For instance, related embodiments may also be employed to connect two expansion units to one another and/or to a common control box, as workers will appreciate.

And, workers will understand that a satellite unit may, according to this invention, be place at various locations with respect to the computer unit; without need to couple the satellite unit out any particular surface of the computer. Also, several satellite units may use a subject interlocking bridge means to intercouple any number of boxes.

The above examples of possible variations of the present invention are merely illustrative. While variations in these various embodiments may not, each, yield all the mentioned advantages, certain features may loom more important than others depending on the application. Accordingly, this invention is to be considered as including all possible modifications and variations coming within the scope of the appended claims, and to be limited only by these claims.

What is claimed is:

1. In a system having first and second modules, each module having at least one coupling-face the combination therewith of a thin planar one-piece coupling structure for effecting removable engagement of the modules by removably inter-coupling said modules, each said coupling face being arranged to exhibit an array of engagement means carried thereon; said coupling structure having opposed like first and second engagement surfaces, each said surface presenting an array of coupling means for each engaging said engagement means, said couple means being configured to be conjunctively thrust engagingly toward the engagement means for conjunctive removable coupling therewith when said coupling faces are presented in parallel, registered confronting spaced relation in registry and coupled, so that, with said coupling structure inserted in registry between said confronting module faces, a, slight, lateral thrust of the structure can intercouple the modules.

2. In a system having like first and second modules with cooperating couple means disposed along respective first and second walls thereof, an improved coupling arrangement for effecting easy engagement-disengagement of the modules, this arrangement comprising:

a plurality of like regularly-spaced coupling means carried on each said wall and deployed therein in respective first and second coupling-patterns;

thin, one-piece planar bridge means, having like opposing couple-faces, these faces each exhibiting a prescribed first and second pattern of engagement means, each deployed to correspond to a respective coupling member and configured to interfit, removably, therewith when diposed operatively adjacent thereto, and when said bridge means is shifted slightly in a prescribed coupling-direction, said first coupling pattern corresponding to said first engagement pattern, said second engagement pattern corresponding to said second coupling pattern.

3. An arrangement comprising a base housing for an electrical control unit adapted to be removably attached to one or more like related satellite housings, said base housing being characterized by one or more like outer attachment faces, each said attachment-face including first attachment means dispersed across the length breadth of the face; each said satellite housing having one or more couple-faces, each said couple-face matching said attachment-faces and including other attachment means dispersed across the length and breadth of the face and, in combination therewith, thin, planar bridge means having a pair of opposed like first and second join-sides, each join side matching a respective said attachment means when a said attachment face is brought confrontingly, operatively adjacent and aligned with a said couple-face, being coplanar and separated by a prescribed gap; with said coupling means introduced into said gap to bridge it and be removably joined with both said confronting faces.

4. A connection arrangement for removably connecting a prescribed base machine unit and one or more associated, like satellite machine units, each unit having at least one join-face, this arrangement comprising:

bridge-coupling means comprising a thin, planar structure presenting a pair of opposed like couple-sides, each side having coupling means;

said base machine unit and said satellite unit, each having at last one join-face characterized by attachment means thereon; each attachment being disposed to correspond with a respective one of said coupling when join-faces of said base unit and satellite unit are located in closely-opposed relation to one another, being coplanar, aligned and separated by a prescribed gap, said bridge-coupling means being adapted to be removably engaged with both confronting join-faces via said respective coupling means engaging said attachment means.

5. An arrangement for coupling one machine module to another like module, this arrangement comprising a thin planar one-piece coupling structure separate from said modules and exhibiting a pair of like planar opposed coupling faces, each said face having coupling means; at least one join-face of each said module being provided with attachment means, each attachment means being positioned to be horizontally-, removably-engaged with respective coupling means on a said coupling face, by relative horizontal movement.

6. The arrangement of claim 5, wherein said attachment means is constructed to be the complementing opposite of respective couple means.

7. A method of arranging related machine modules to be conveniently, simply, removably inter-coupled, this method comprising:

providing a thin, planar, one-piece coupling structure, separate from said modules and removably attachable thereto, while also exhibiting a pair of like planar opposed coupling faces, each said face having couple means disposed on thereon; providing at least one join-face on each said module with attaching means, being positioned and configured to be removably-engaged with couple means on a said coupling face.

8. The method of claim 7 wherein each said attaching means is constructed to be the complementing opposite of its respective couple means.

9. The method of claim 8 wherein each column of attaching means comprises like alternating down-facing/up-facing structures.

10. The method of claim 7, wherein at least one of said join-faces includes switch means; and wherein a bottom foot portion of said structure is adapted and disposed to actuate said switch means when said coupling structure is inserted.

11. The arrangement of claim 7, wherein at least some of said attaching-columns are provided with thin elongate rib means disposed adjacent thereto and adapted for guiding engagement of said bridge means.

12. The arrangement of claim 8, wherein said couple-columns are deployed on a respective pillar projection adapted to fit between attaching-columns and to guidingly engage said rib means.

13. The arrangement of claim 2, wherein each said attaching member is constructed to be the complementing opposite of its respective engaging couple member.

14. The arrangement of claim 2, wherein at least one of said walls includes switch means; and wherein a bottom foot portion of said bridge means is arranged to actuate said switch means when said bridge means is fully engaged.

15. A method of arranging related machine modules to be removalby inter-coupled, these modules having cooperating pin and socket connector means disposed along respective first and second walls thereof, this method comprising:

providing engaging means carried on each said wall; and providing a thin, one piece planar bridge means, having like opposing couple-faces, these faces each being made to exhibit a prescribed first and second couple means being deployed to correspond to a respective engaging member and configured to interfit, removably, therewith when disposed operatively adjacent thereto, and when said bridge means is shifted slightly in a prescribed coupling-direction.

16. The method of claim 15 wherein said engaging members are deployed across a said wall in columns uniformly spaced across the width of the wall, and wherein said couple members are similarly deployed in like-spaced columns across their coupling face, these facing wall/coupling faces to be disposed relatively parallel for inter-engagement.

17. The method of claim 16, wherein the couple means on one coupling face of said bridge means are deployed to be offset laterally a prescribed spacing from the engaging member on a facing wall so as to be slid-down therebetween and then slid transversely, to engage corresponding engaging and couple means.

18. The method of claim 17, wherein at least some of said engaging are provided with thin elonate rib means disposed adjacent thereto and adapted for guiding engagement of said coupling bridge means.

19. The method of claim 18, wherein each said engaging means is constructed to be the complementing engageable opposite of respective couple means.

* * * * *